US010908829B2

(12) United States Patent
Huang

(10) Patent No.: US 10,908,829 B2
(45) Date of Patent: Feb. 2, 2021

(54) MEMORY CALIBRATION METHOD AND SYSTEM, AND VEHICLE SYSTEM

(71) Applicant: AutoChips Inc., Hefei (CN)

(72) Inventor: Qiyun Huang, Hefei (CN)

(73) Assignee: AUTOCHIPS INC., Hefei (CN)

(*) Notice: Subject to any disclaimer, the term of this patent is extended or adjusted under 35 U.S.C. 154(b) by 80 days.

(21) Appl. No.: 16/517,702

(22) Filed: Jul. 22, 2019

(65) Prior Publication Data
US 2020/0210084 A1 Jul. 2, 2020

(30) Foreign Application Priority Data

Dec. 26, 2018 (CN) .......................... 2018 1 1601677

(51) Int. Cl.
G11C 29/00 (2006.01)
G06F 3/06 (2006.01)
G11C 29/38 (2006.01)
G11C 14/00 (2006.01)
G06F 11/10 (2006.01)

(52) U.S. Cl.
CPC .......... *G06F 3/0632* (2013.01); *G06F 3/0604* (2013.01); *G06F 3/0659* (2013.01); *G06F 3/0683* (2013.01); *G06F 11/1004* (2013.01); *G11C 14/0009* (2013.01); *G11C 29/38* (2013.01)

(58) Field of Classification Search
CPC .... G06F 3/0632; G06F 3/0604; G06F 3/0659; G06F 3/0683; G06F 11/004; G11C 14/0009; G11C 29/38
See application file for complete search history.

(56) References Cited

U.S. PATENT DOCUMENTS

| 8,261,141 | B1* | 9/2012 | Choe ..................... H03K 5/13 714/721 |
| 9,323,538 | B1* | 4/2016 | Blunno ............... G11C 29/022 |
| 2011/0270559 | A1* | 11/2011 | Christophersen .... G01R 31/389 702/65 |
| 2018/0366168 | A1* | 12/2018 | Naruse ............... G06F 13/4234 |
| 2020/0210084 | A1* | 7/2020 | Huang ................ G11C 29/028 |

* cited by examiner

Primary Examiner — Christine T. Tu

(57) ABSTRACT

A memory calibration method and system and a vehicle system are disclosed. The method includes reading a first set of data from a first memory, wherein the first set of data includes pre-stored parameters for calibrating a second memory comprising a controller; performing a first verification process on the first set of data; performing a second verification process on the first set of data when the first set of data passes the first verification process; adopting the first set of data to configure the controller of the second memory when the first set of data passes the second verification process; and performing a test for the second memory to determine whether finishing a current calibration process for the second memory, wherein the second memory has been calibrated when the second memory passes the test.

20 Claims, 4 Drawing Sheets

MEMORY CALIBRATION METHOD AND SYSTEM, AND VEHICLE SYSTEM

CROSS-REFERENCE TO RELATED APPLICATIONS

This application claims priority to Chinese Patent Application No. 201811601677.5, filed on Dec. 26, 2018, the content of which is herein incorporated by reference in its entirety.

TECHNICAL FIELD

The present disclosure relates to the field of memory technologies, and in particular, to a memory calibration method and system, and a vehicle system.

BACKGROUND

Each time an electronic device is booted, a processor of the electronic device firstly runs a boot program that is solidified inside the chip of the processor, and then moves the boot program to the static random access memory (SRAM) of the chip to inn. Various necessary Phase Locked Loops (PLLs) may be configured and a controller of Dynamic Random Access Memory (DRAM) may be initialized by the boot program, preparing for the subsequent use of DRAM. During the controller of DRAM is initialized, all the parameters of the DRAM are calibrated to obtain parameters which are required for the DRAM to operate normally.

In the long-term development process, the inventor of the present disclosure found that in the related art, it takes a long time to acquire all the parameters of the DRAM each time the DRAM is calibrated.

SUMMARY OF THE DISCLOSURE

According to one aspect of the present disclosure, a memory calibration method is provided. The method includes reading a first set of data from a first memory, wherein the first set of data comprises pre-stored parameters for calibrating a second memory comprising a controller; performing a first verification process on the first set of data; performing a second verification process on the first set of data when the first set of data passes the first verification process; adopting the first set of data to configure the controller of the second memory when the first set of data passes the second verification process; and performing a test for the second memory to determine whether finishing a current calibration process for the second memory, wherein the second memory has been calibrated when the second memory passes the test.

According to another aspect of the present disclosure, a memory calibration system is provided. The memory calibration system includes a second memory, a first memory, and a processor. The second memory includes a controller. The first memory stores a first set of data, the first set of data, wherein the first set of data comprises pre-stored parameters for calibrating the second memory. The processor is configured to determine whether the first set of data is valid, adopt the first set of data to configure the controller of the second memory when the first set of data is valid, and perform a test for the second memory to determine whether finishing a current calibration process for the second memory, wherein the second memory has been calibrated when the second memory passes the test.

According to yet another aspect of the present disclosure, a vehicle system is provided. The vehicle system includes a second memory, a first memory, and a processor. The second memory includes a controller. The first memory stores a first set of data, the first set of data, wherein the first set of data comprises pre-stored parameters for calibrating the second memory. The processor is configured to read a first set of data from the first memory; perform a first verification process on the first set of data; perform a second verification process on the first set of data when the first set of data passes the first verification process; adopt the first set of data to configure the controller of the second memory when the first set of data passes the second verification process; and perform a test for the second memory to determine whether finishing a current calibration process for the second memory, wherein the second memory has been calibrated when the second memory passes the test.

BRIEF DESCRIPTION OF THE DRAWINGS

In order to make the technical solution described in the embodiments of the present disclosure more clearly, the drawings used for the description of the embodiments will be briefly described. Apparently, the drawings described below are only for illustration but not for limitation. It should be understood that, one skilled in the art may acquire other drawings based on these drawings, without making any inventive work.

DETAILED DESCRIPTION

The technical solutions in the embodiments of the present disclosure are described in conjunction with the drawings in the embodiments of the present disclosure. It is obvious that the described embodiments are only a part of tire embodiments of the present disclosure, and not all embodiments. All other embodiments obtained by the ordinary skilled in the art based on the embodiments in the present disclosure without the creative work are all within the scope of the present disclosure.

Figure 1:
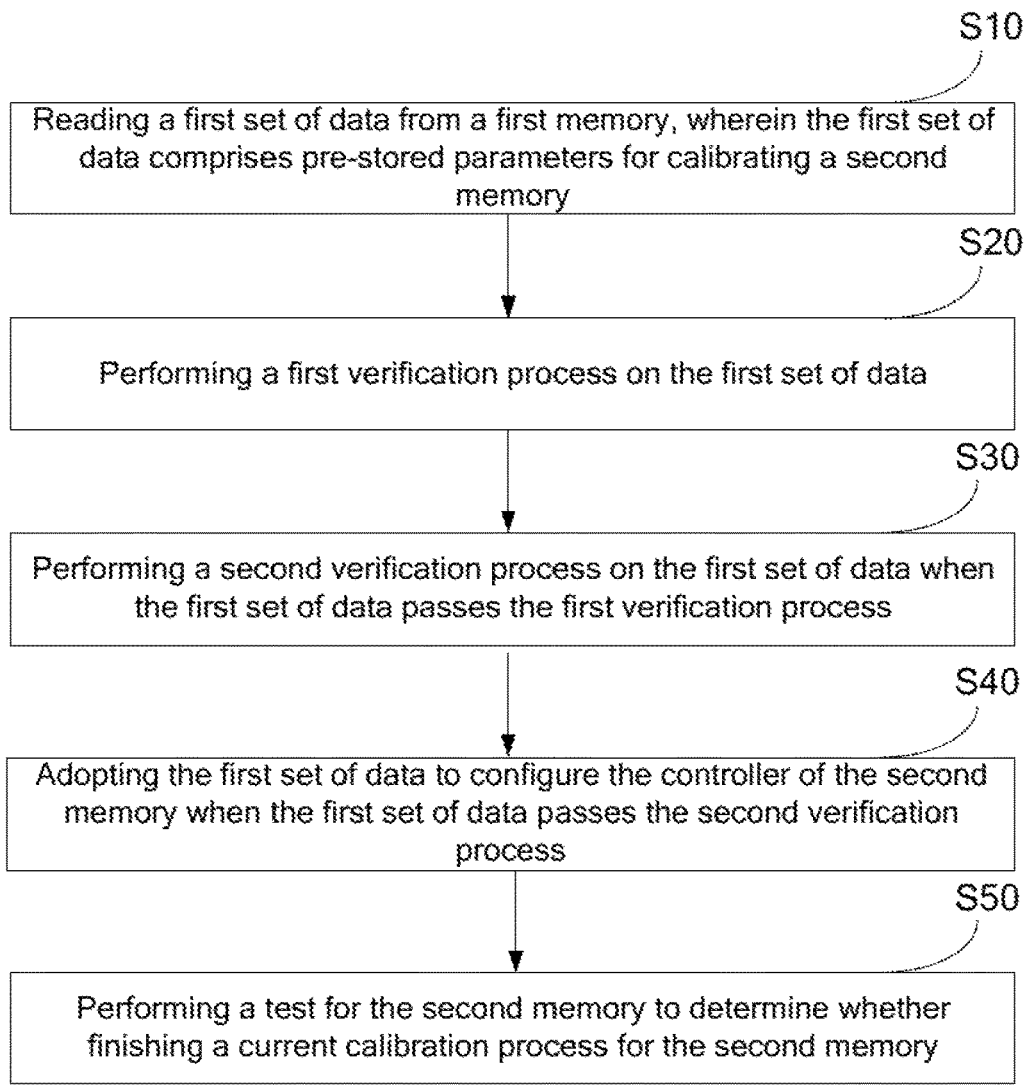
FIG. 1 is a flow chart of a memory calibration method according to an embodiment of the present disclosure.

FIG. 1 is a flow chart of a memory calibration method according to an embodiment of the present disclosure. The method can be applied to a device such as a vehicle device or a computer. The method may include actions/operations in the following blocks.

At block S10, a first set of data is read from a first memory, wherein the first set of data includes pre-stored parameters for calibrating a second memory.

In one embodiment, the first memory is a non-volatile memory such as a flash, and the second memory is a volatile memory such as a DRAM.

In this embodiment, the first set of data is read from the first memory according to the current environmental condition. The pre-stored parameters of the first set of data are obtained from a previous calibration process as parameters for the second memory to operate normally and are stored into the first memory. In the previous calibration process, the second memory is calibrated to obtain parameters for the second memory to operate normally and be stored into the first memory. That is, when the second memory has been calibrated, the second memory operates normally. Thus, the pre-stored parameters of the first set of data are parameters for the second memory to operate normally. In an embodiment, taking the second memory being a DRAM as an example, in a case where a controller of the DRAM supports dynamic voltage and frequency scaling (DVFS), the controller of the DRAM has several fixed working voltages, each of which corresponds to the first set of data of which data structure is struct dram_parameters. The pre-stored parameters are stored in the first memory. When booting-up occurs, the corresponding first set of data are selected according to a working voltage of the controller currently selected.

The first set of data further includes a magic number and a pre-stored cyclic redundancy check code. The cyclic redundancy check code is calculated based on the pre-stored parameters.

The data structure of the first set of data stored in the first memory is struct dram_parameters {u32 magic: u32 crc32; struct parameters {u32 write_leveing_dly; u32 gatiuug_dly; u32 rxdly; u32 tx_dly; u32 tx_vrcf; . . . } para; . . . }. The pre-stored parameters refer to struct parameters in the data structure of the first set of data.

In an embodiment, taking the second memory being a DRAM as an example to describe, the pre-stored parameters include parameters specified by the double data rate (DDR) standard and parameters defined by the controller of the DRAM. The parameter specified by the DDR standard may be a command address delay, command address vref, write leveling delay, gating delay, rx_dly, tx_dly, rx_dq_vref, tx_dq_vref, etc. Parameteis defined by the DRAM controller may vary as the controller of the DRAM varies. For example, the pull-up capability, the pull-down capability, and impedance of the controller of the DRAM may have an effect on values of the parameters.

At block S20, a first verification process is performed on the first set of data.

Figure 2:
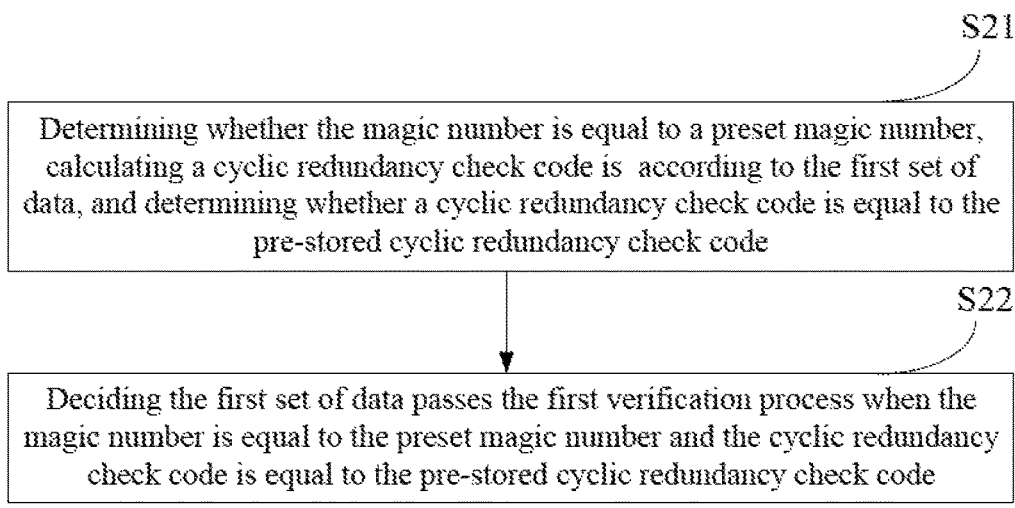
FIG. 2 is a flow chart of a memory calibration method according to an embodiment of the present disclosure.

As shown in FIG. 2, in one embodiment, the step of pet forming the first verification process on the first set of data includes actions/operations in the following blocks.

At block S21, whether a magic number in the first set of data is equal to a preset magic number is determined, a cyclic redundancy check code is calculated according to the first set of data, and whether the cyclic redundancy check code is equal to a pre-stored cyclic redundancy check code is determined.

In an embodiment, the preset magic number is 0x12345678. Whether the magic number is equal to 0x12345678 is determined. If the magic number is equal to 0x12345678, the comparison for the magic number is completed.

It can be understood that, the first set of data includes pre-stored parameters, a magic number, and a pre-stored cyclic redundancy check code, and in one embodiment, the cyclic redundancy check code is calculated according to the pre-stored parameters.

At block S22, it is decided that the first set of data passes the first verification process when the magic number is equal to the preset magic number and the cyclic redundancy check code is equal to the pre-stored cyclic redundancy check code.

Further, if the magic number is not equal to the preset magic number or/and the cyclic redundancy check code is not equal to the pre-stored cyclic redundancy check code, all calibration parameters of the second memory are calculated to obtain second set of data. That is, the second set of data includes all calibration parameters of the second memory. The second set of data are then adopted to configure a controller of the second memory. In one embodiment, the second set of data are stored into the first memory as the pre-stored parameters for a next calibration process.

At block S30, a second verification process is performed on the first set of data when the first set of data passes the first verification process.

Figure 3:
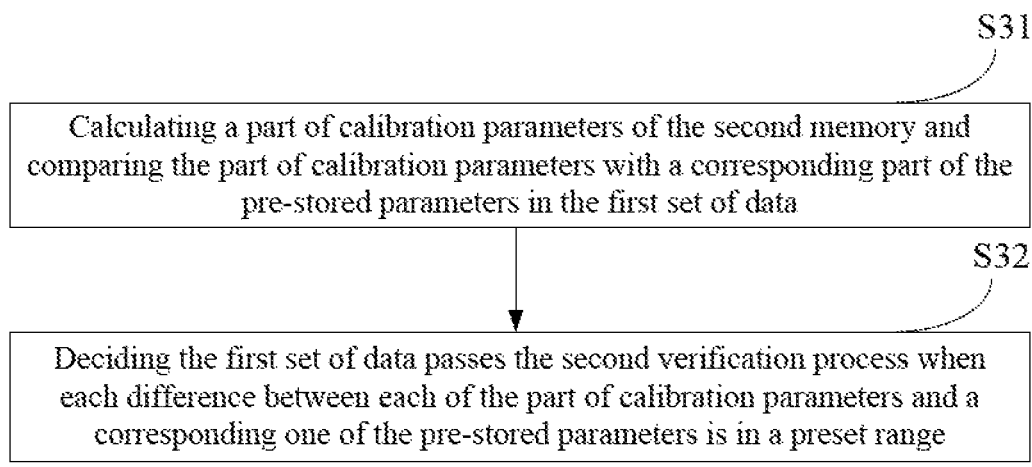
FIG. 3 is a flow chart of a memory calibration method according to an embodiment of the present disclosure.

As shown in FIG. 3, in one embodiment, the step of performing the second verification process on the first set of data includes actions/operations in the following blocks.

At block S31, a part of calibration parameters of the second memory are calculated, and the part of calibration parameters are compared with a corresponding part of the pre-stored parameters in the first set of data.

At block S32, it is decided that the first set of data passes the second verification process when each difference between each of the part of calibration parameters and a corresponding one of the pre-stored parameters is in a preset range.

The calculation manner for calculating calibration parameters may be a dynamic random access memory calibration algorithm. The difference refers to an absolute value between a calibration parameter and a corresponding pre-stored parameter and the preset range is 0 to 10%, for example, 1%, 5% or 10%, etc. If a difference range between the calibration parameter and the corresponding pre-stored parameter exceeds 10%, the device will not be able to boot and cannot work.

The gating delay is one of the important calibration parameters, which is easily affected by a voltage and a temperature. Taking the calibration parameters being the delay as an example, the delay, which is obtained in the calculation manner, is compared with a delay specified in the first memory, and the controller of the second memory is configured by the first set of data in the first memory if a difference range between the delay obtained in the calculation maimer and the delay specified in the first memory is 0 to 10%.

At block S40, the first set of data is adopted to configure the controller of the second memory when the first set of data passes the second verification process.

Further, all calibration parameters of the second memory are calculated to obtain the second set of data if a difference between any one of the part of calibration parameters and a corresponding one of the pre-stored parameters are not in the preset range. That is the second set of data includes all calibration parameters of the second memory. The second set of data is then used to configure the controller of the second memory. In one embodiment, the second set of data are stored into the first memory as the pre-stored parameters for a next calibration process.

At block S50, a test is performed for the second memory to determine whether finishing a current calibration process for the second memory, wherein the second memory has been calibrated when the second memory passes the test.

That is, when the second memory passes the test, the current calibration process is completed. Further, all calibration parameters of the second memory are calculated to obtain the second set of data if the second memory fails the test. That is, the second set of data includes all calibration parameters of the second memory. The second set of data is then used to configure the controller of the second memory. In one embodiment, the second set of data are stored into the first memory as the pre-stored parameters for a next calibration process.

It can be understood that a Read/Write test may be performed for the second memory. If the second memory passes the Read/Write test, it is decided that the pre-stored parameters in the first memory are available, and the current calibration process of the second memory is completed. If the second memory fails the Read/Write test, all the parameters of the second memory are calibrated to obtain the second set of data, and the second set of data is then used to configure the controller of the second memory. The second set of data may be stored into the first memory as the pre-stored parameters for a next calibration process.

In the actual use process, some parameters of the DRAM are basically unchanged after boot-up occurs. For example, some parameters are related to temperature, voltage, etc., and these parameters, which are calibrated under a condition that the temperature and voltage vary lightly, vary lightly. In the memory calibration method according to an embodiment of the present disclosure, when the parameters of the second memory are needed to be acquired, the first set of data is firstly read from the first memory and includes the pre-stored parameters for calibrating the second memory. The first set of data can be directly used to configure the controller of the second memory in a case where the first set of data is available. Only a part of the calibration parameters of the second memory is calculated in a process of determining whether the first set of data is available, instead of calculating all the calibration parameters of the second memory. It can save time for configuring the second memory, and thus speeds up the boot-up.

Figure 4:
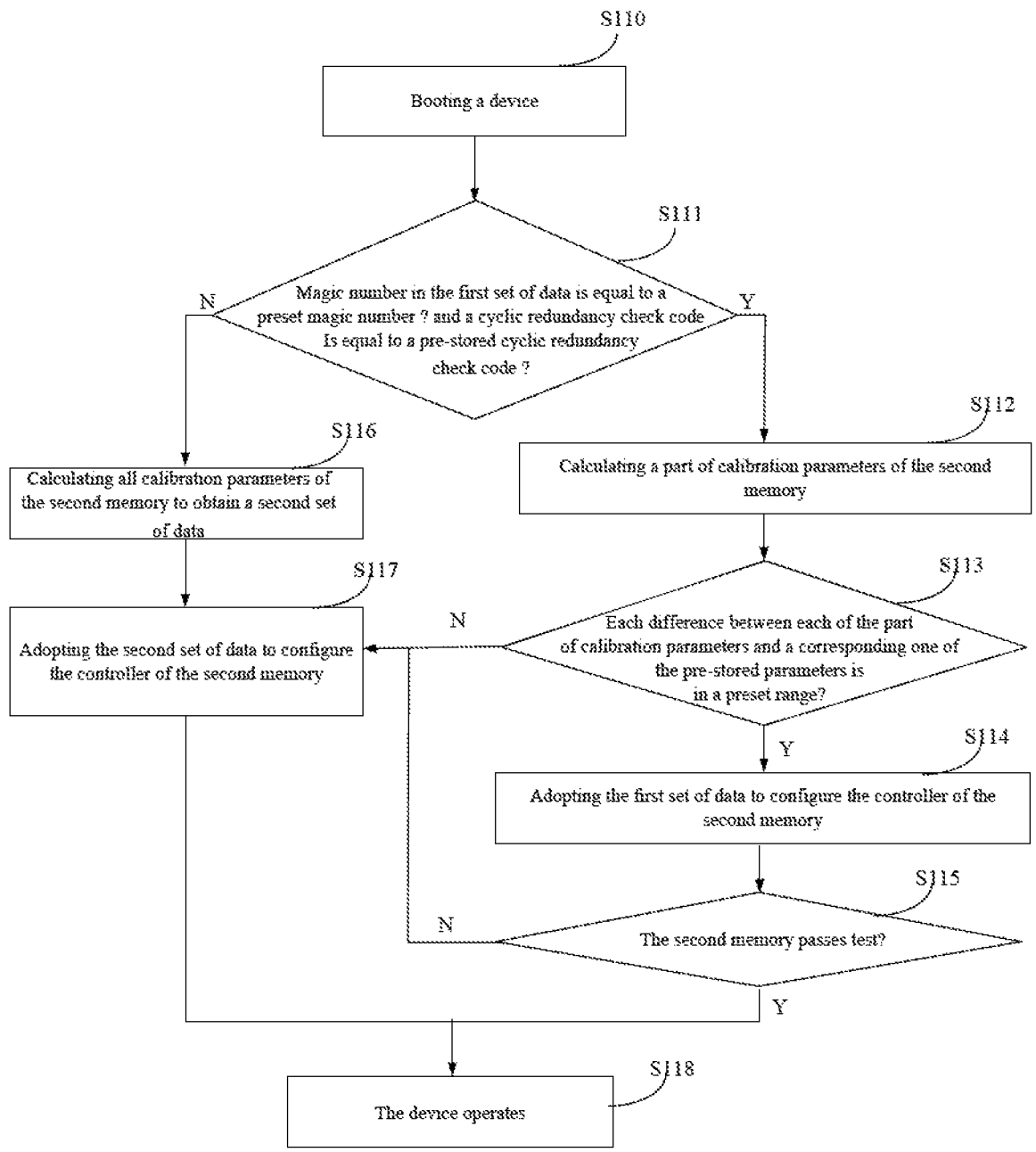
FIG. 4 is a flow chart of a memory calibration method according to another embodiment of the present disclosure.

FIG. 4 is a flow chart of a memory calibration method according to another embodiment of the present disclosure. The method includes actions/operations in the following blocks.

At block S110, a device is booted.

At block S111, whether a magic number in the first set of data is equal to a preset magic number is determined, a cyclic redundancy check code is calculated according to the first set of data, and whether the cyclic redundancy check code is equal to a pre-stored cyclic redundancy check code is determined. If die magic number is equal to the preset magic number, and the cyclic redundancy check code is equal to the pre-stored cyclic redundancy check code, it is determined that the first set of data passes the first verification process, and then block S112 is performed. If the magic number is not equal to the preset magic number and/or the cyclic redundancy check code is not equal to the pre-stored cyclic redundancy check code, the S116 is performed.

At block S112, a part of calibration parameters of the second memory are calculated.

At block S113, the part of calibration parameters are compared with a corresponding part of the pre-stored parameters in the first set of data to determine whether each difference between each of the part of calibration parameters and a corresponding one of the pre-stored parameters is in a preset range. If each difference between each of the part of calibration parameters and a corresponding one of the pre-stored parameters are in a preset range, then block S114 is performed. If a difference between any one of the part of calibration parameters and a corresponding one of pre-stored parameters are not in a preset range, block S116 is performed.

At block S114, the first set of data is used to configure a controller of the second memory, and then block S115 is performed.

At block S115, a test is performed on the second memory to determine whether the second memory passes the test. Whether the second memory passes the test means whether a current calibration process for the second memory is finished. If the second memory passes the test, meaning the current calibration process is completed, block S118 is performed. If the second memory fails the test, block S116 is performed.

At block S116, all the calibration parameters of the second memory are calculated to obtain the second set of data, and then block S117 is performed.

At block S117, the second set of data is adopted to configure the controller of the second memory, and then block S118 is performed. The second set of data may be stored into the first memory as pre-stored parameters for a next calibration process.

At block S118, the device is operated.

Different from what in the related art. In the memory calibration method according to an embodiment of the present disclosure, when the parameters of the second memory are needed to be acquired, the first set of data is firstly read from the first memory and includes the pre-stored parameters for calibrating the second memory. The first set of data can be directly used to configure the controller of the second memory in a case where the first set of data is available. Only a part of the calibration parameters of the second memory is calculated in a process of determining whether the first set of data is available, instead of calculating all the calibration parameters of the second memory. It can save time for configuring the second memory, and thus speeds up the boot-up.

Figure 5:
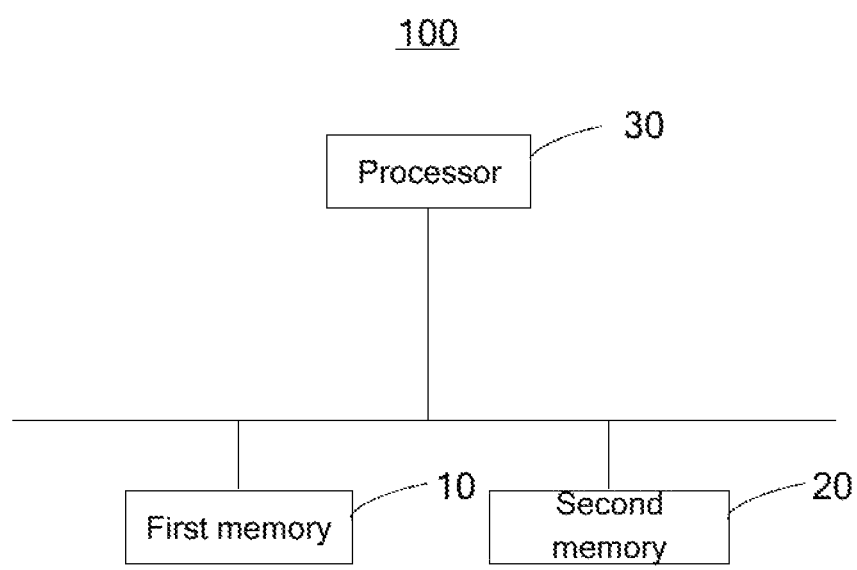
FIG. 5 is a structural diagram of a memory calibration system according to an embodiment of the present disclosure.

FIG. 5 is a structural diagram of a memory calibration system for according to an embodiment of the present disclosure. The memory calibration system 100 can be applied to automobiles, computers, and the like. The memory calibration system 100 includes a first memory 10, a second memory 20, and a processor 30. A first set of data is stored in the first memory 10. The processor 30 is configured to read the first set of data from the first memory 10. The first set of data includes pre-stored parameters for calibrating the second memory 20. The processor 30 is further configured to perform a first verification process and a second verification process on the first set of data to determine whether the first set of data is valid. If the first set of data is valid, the first set of data is used to configure a controller of the second memory 20. The processor 30 is further used to perform a test on the second memory 20. If the second memory 20 passes the test, the calibration process of the second memory 20 is completed.

The first set of data also includes a magic number and a pie-stored cyclic redundancy check code, and the cyclic redundancy check code is calculated based on the pre-stored parameters.

The processor 30 is further configured to compare the magic number in the first set of data with the preset magic number, calculate a cyclic redundancy check code according to the first set of data, and compare the cyclic redundancy check code with the pre-stored cyclic redundancy check code, to determine whether the magic number is equal to the preset magic number and whether die cyclic redundancy check code is equal to the pre-stored cyclic redundancy check code. If the magic number is equal to the preset magic number and the cyclic redundancy check code is equal to the pre-stored cyclic redundancy check code, it is determined that the first set of data passes die first verification process.

The processor 30 is further configured to calculate a part of calibration parameters of the second memory, and compare the part of calibration parameters with a corresponding part of the pre-stored parameters in the first set of data to determine whether each difference between each of the part of calibration parameters and a corresponding one of die pre-stored parameters in die first set of data is in a preset range.

Further, if die magic number is not equal to the preset magic number or/and the cyclic redundancy check code is not equal to the pre-stored cyclic redundancy check code, or a difference between any one of the part of calibration parameters and a corresponding one of the pre-stored parameters are not in the preset range, or the second memory fails the test fails, the processor 30 is further configured to calculate all calibration parameters of the second memory 20 to obtain second set of data and use the second set of data to configure the controller of the second memory. The second set of data may be stored into the first memory as pre-stored parameters for a next calibration process. The difference refers to the absolute value between the calibration parameter and the corresponding pre-stored parameter, and the preset range is 0~10%.

Figure 6:
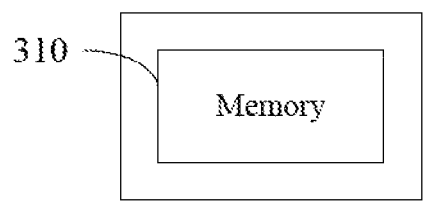
FIG. 6 is a structural diagram of a readable storage medium according to an embodiment of the present disclosure.

FIG. 6 is a structural diagram of a readable storage medium according to an embodiment of the present disclosure. The readable storage medium of the present disclosure includes a memory 310 that stores instructions. When the instructions are executed, a memory calibration method of the present disclosure is implemented.

The memory 310 may include a read-only memory (ROM), a random access memory (RAM), a flash memory, a hard disk, an optical disk, and the like.

What mentioned above is only embodiments of the present disclosure, and is not intended to limit the scope of the present disclosure, and the equivalent structure or equivalent process transformations made by the description of the present disclosure and the drawings, or direct or indirect application to other related technologies are all included in the scope of the present disclosure.

What is claimed is:

1. A memory calibration method, comprising:
   reading a first set of data from a first memory, wherein the first set of data comprises pre-stored parameters for calibrating a second memory comprising a controller;
   performing a first verification process on the first set of data;
   performing a second verification process on the first set of data when the first set of data passes the first verification process;
   adopting the first set of data to configure the controller of the second memory when the first set of data passes the second verification process; and
   performing a test for the second memory to determine whether finishing a current calibration process for the second memory, wherein the second memory has been calibrated when the second memory passes the test.

2. The method of claim 1, wherein the performing the second verification process on the first set of data comprises:
   calculating a part of calibration parameters of the second memory;
   comparing the part of calibration parameters with a corresponding part of the pre-stored parameters in the first set of data; and
   deciding the first set of data passes the second verification process when each difference between each of the part of calibration parameters and a corresponding one of the pre-stored parameters is in a preset range.

3. The method of claim 2, further comprising:
   calculating all calibrations parameters of the second memory to obtain a second set of data comprising the all calibration parameters of the second memory, when a difference between any one of the part of calibration parameters and a corresponding one of the pre-stored parameters is not in the preset range; and
   adopting the second set of data to configure the controller of the second memory.

4. The method of claim 3, wherein the pre-stored parameters of the first set of data are obtained from a previous calibration process as parameters for the second memory to operate normally and are stored into the first memory; and
   the method further comprises:
   storing the second set of data into the first memory as the pre-stored parameters for a next calibration process.

5. The method of claim 3, wherein the second memory is a dynamic random access memory (DRAM); and
   the calibration parameters of the second memory are calculated in a calibration algorithm for the DRAM.

6. The method of claim 5, wherein the preset range is 0~10%.

7. The method of claim 1, wherein the first set of data further comprises a magic number and a pre-stored cyclic redundancy check code; and
   the performing the first verification process on the first set of data comprises:
   determining whether the magic number is equal to a preset magic number and whether a cyclic redundancy check code is equal to the pre-stored cyclic redundancy check code, wherein the cyclic redundancy check code is calculated based on the pre-stored parameters; and
   deciding the first set of data passes the first verification process when the magic number is equal to the preset magic number and the cyclic redundancy check code is equal to the pre-stored cyclic redundancy check code.

8. The method of claim 7, further comprising:
   calculating all calibration parameters of the second memory to obtain a second set of data comprising the all calibration parameters of the second memory, when the magic number is unequal to the preset magic number and/or the cyclic redundancy check code is unequal to the pre-stored cyclic redundancy check code; and
   adopting the second set of data to configure the controller of the second memory.

9. The method of claim 8, wherein the pre-stored parameters of the first set of data are obtained from a previous calibration process as parameters for the second memory to operate normally and are stored into the first memory, and
   the method further comprises:
   storing the second set of data into the first memory as the pre-stored parameters for a next calibration process.

10. The method of claim 9, wherein the second memory is a dynamic random access memory (DRAM); and
    the calibration parameters of the second memory are calculated in a calibration algorithm for the DRAM.

11. The method of claim 1, further comprising:
    calculating all calibration parameters of, the second memory to obtain a second set of data comprising the all calibration parameters of the second memory, when the second memory fails the test; and adopting the second set of data to configure the controller of the second memory.

12. The method of claim 11, wherein the pre-stored parameters of the first set of data are obtained from a previous calibration process as parameters for the second memory to operate normally and are stored into the first memory; and the method further comprises:

storing the second set of data into the first memory as the pre-stored parameters for a next calibration process.

13. The method of claim 12, the test is a read/write test.

14. The method of claim 11, wherein the second memory is a dynamic random access memory (DRAM); and the calibration parameters of the second memory are calculated in a calibration algorithm for the DRAM.

15. The method of claim 1, wherein the first memory is a non-volatile memory, and the second memory is a dynamic random access memory (DRAM); and the first set of data is selected based on a current working voltage of the controller of the second memory.

16. A memory calibration system, comprising:

a second memory comprising a controller;

a first memory storing a first set of data, wherein the first set of data comprises pre-stored parameters for calibrating the second memory; and a processor configured to determine whether the first set of data is valid, adopt the first set of data to configure the controller of the second memory when the first set of data is valid, and perform a test for the second memory to determine whether finishing a current calibration process for the second memory, wherein the second memory has been calibrated when the second memory passes the test.

17. The system of claim 16, wherein the processor is further configured to calculate all calibration parameters of the second memory to obtain a second set of data comprising the all calibration parameters of the second memory when the first of data is invalid or the second memory fail the test; and adopting the second set of data to configure the controller of the second memory.

18. The system of claim 17, wherein the pre-stored parameters of the first set of data are obtained from a previous calibration process as parameters for the second memory to operate normally and are stored into the first memory; and the processor is further configured to store the second set of data into the first memory as the pre-stored parameters for a next calibration process.

19. A vehicle system, comprising:

a second memory comprising a controller;

a first memory storing a first set of data, wherein the first set of data comprises pre-stored parameters for calibrating the second memory; and a processor configured to:

read a first set of data from the first memory;

perform a first verification process on the first set of data:

perform a second verification process on the first set of data when the first set of data passes the first verification process:

adopt the first set of data to configure the controller of the second memory when the first set of data passes the second verification process; and perform a test for the second memory to determine whether finishing a current calibration process for the second memory, wherein the second memory has been calibrated when the second memory passes the test.

20. The vehicle system of claim 19, wherein the first memory is a non-volatile memory, and the second memory is a dynamic random access memory (DRAM); and the first set of data is selected based on a current working voltage of the controller of the second memory.

* * * * *